US010476305B2

(12) United States Patent
Freer et al.

(10) Patent No.: US 10,476,305 B2
(45) Date of Patent: Nov. 12, 2019

(54) POWER AND DATA TRANSMISSION BETWEEN EXPLOSION PROOF DEVICES AND INTRINSICALLY SAFE DEVICES

(71) Applicant: EATON INTELLIGENT POWER LIMITED, Dublin (IE)

(72) Inventors: Benjamin Avery Freer, Syracuse, NY (US); Stephan P. Iannce, Clay, NY (US)

(73) Assignee: EATON INTELLIGENT POWER LIMITED, Dublin (IE)

(*) Notice: Subject to any disclaimer, the term of this patent is extended or adjusted under 35 U.S.C. 154(b) by 185 days.

(21) Appl. No.: 15/278,836

(22) Filed: Sep. 28, 2016

(65) Prior Publication Data

US 2017/0093220 A1    Mar. 30, 2017

Related U.S. Application Data

(60) Provisional application No. 62/233,873, filed on Sep. 28, 2015, provisional application No. 62/233,801, filed on Sep. 28, 2015.

(51) Int. Cl.
H02J 50/12     (2016.01)
H05K 5/02     (2006.01)
H04B 5/00     (2006.01)
H01F 38/14    (2006.01)
H02J 50/80    (2016.01)
H02J 7/00     (2006.01)

(52) U.S. Cl.
CPC .............. H02J 50/12 (2016.02); H01F 38/14 (2013.01); H02J 50/80 (2016.02); H04B 5/0037 (2013.01); H05K 5/0217 (2013.01); H02J 2007/0098 (2013.01)

(58) Field of Classification Search
CPC .... H02J 50/12; H02J 50/80; H02J 2007/0098; H04B 5/0037; H01F 38/14; H05K 5/0217
See application file for complete search history.

(56) References Cited

U.S. PATENT DOCUMENTS

| 6,912,137 B2 | 6/2005 | Berghegger |
| 7,825,537 B2 | 11/2010 | Freer |
| 8,971,072 B2 | 3/2015 | Calvin et al. |
| 2007/0223180 A1 | 9/2007 | Becker et al. |
| 2010/0061733 A1* | 3/2010 | Loechner ........... G05B 19/4185 398/128 |

(Continued)

OTHER PUBLICATIONS

International Search Report and Written Opinion for Application No. PCT/US2016/054225 dated Jan. 9, 2017.

Primary Examiner — Jared Fureman
Assistant Examiner — Michael J Warmflash
(74) Attorney, Agent, or Firm — Merchant & Gould P.C.

(57) ABSTRACT

A system comprises an explosion proof device and an intrinsically safe device. The explosion proof device is coupled to a power supply. The intrinsically safe device includes a user interface. The explosion proof device is configured to induce inductive coupling with the intrinsically safe device. The inductive coupling between the explosion proof device and the intrinsically safe device enables the transfer of power from the explosion proof device to the user interface of the intrinsically safe device. The inductive coupling can additionally enable the transfer of data between the explosion proof device and the intrinsically safe device.

28 Claims, 7 Drawing Sheets

(56) References Cited

U.S. PATENT DOCUMENTS

| | | | | |
|---|---|---|---|---|
| 2010/0097235 A1* | 4/2010 | Holloway | G01R 1/0408 | 340/660 |
| 2010/0159823 A1* | 6/2010 | Smith | H04B 7/155 | 455/7 |
| 2010/0218838 A1* | 9/2010 | Manahan | F16L 5/02 | 138/109 |
| 2010/0284150 A1* | 11/2010 | Manahan | A62C 4/00 | 361/695 |
| 2010/0288467 A1* | 11/2010 | Manahan | F28D 15/00 | 165/54 |
| 2012/0032632 A1* | 2/2012 | Soar | H01F 38/14 | 320/108 |
| 2012/0152381 A1 | 6/2012 | Ungerer et al. | | |
| 2013/0084800 A1* | 4/2013 | Troberg | H04B 5/0037 | 455/41.1 |
| 2013/0162268 A1 | 6/2013 | Pechstein et al. | | |
| 2013/0307348 A1* | 11/2013 | Oettinger | H01F 38/14 | 307/104 |
| 2014/0256188 A1* | 9/2014 | Manahan | H02J 5/005 | 439/660 |
| 2014/0339914 A1* | 11/2014 | Pooley | H02J 50/10 | 307/104 |

* cited by examiner

POWER AND DATA TRANSMISSION BETWEEN EXPLOSION PROOF DEVICES AND INTRINSICALLY SAFE DEVICES

PRIORITY CLAIMS

The present application claims priority to U.S. provisional patent application Nos.: (1) 62/233,801, filed Sep. 28, 2015, and entitled "Inductive Conduit Plug for Explosion Proof Enclosures"; and (2) 62/233,873, filed Sep. 28, 2015, and entitled "Data Transmission Between Explosion Proof Devices and Intrinsically Safe Devices." Both of the noted provisional patent applications are hereby incorporated by reference in their entirety.

FIELD OF THE DISCLOSURE

The present disclosure generally relates to explosion proof devices and intrinsically safe devices, and, more specifically, the transmission of power and data between explosion proof devices and intrinsically safe devices.

BACKGROUND OF THE DISCLOSURE

A major safety concern in industrial plants is the occurrence of fires and explosions. A source of energy is all that is needed to ignite an explosion when flammable gases or combustible dusts are mixed in the proper proportions with air. That source of energy can come from any number of sources within a plant environment however one area of particular concern is the plant's electrical installation which might include electrical components such as switches, circuit breakers, motor starter, pushbutton stations, or plugs and receptacles.

As such, the National Electric Code (NEC) has worked to establish a classification system to classify hazardous locations and to define standards for the types of electrical equipment that may be allowed into the hazardous location. The classes define the type of explosive or ignitable substances which are present in the atmosphere. Class I locations, those locations of particularly relevance to the present disclosure, are those in which flammable vapors and gases may be present. Class I is further subdivided into two divisions. Division 1 is a location in which ignitable concentrations of hazards exists under normal operation conditions and/or where hazard is caused by frequent maintenance or repair work or frequent equipment failure. Division 2 is a location in which ignitable concentrations of hazards are handled, processed or used, but which are normally in closed containers or closed systems from which they can only escape through accidental rupture or breakdown of such containers or systems.

With regard to the types of electrical equipment that may be allowed in a Class I, Division 1 or Division 2 location, the NEC noted that any type of conventional relay, contact, or switch that has an arcing contact must be enclosed in an explosion proof housing. The NEC has defined an Explosionproof Apparatus as an apparatus enclosed in a case that is capable of withstanding an explosion of a specified gas or a vapor that may occur within it and of preventing the ignition of a specified gas or vapor surrounding the enclosure by sparks, flashes, or explosion of the gas or vapor within, and that operates at such an external temperature that a surrounding flammable atmosphere will not be ignited thereby.

Thus, an explosion proof enclosure must prevent the ignition of an explosive gas or vapor that may surround it. In other words, an explosion inside the enclosure must be prevented from starting a larger explosion outside the enclosure. An explosion proof enclosure must further be of adequate strength and be "flame-tight." The term "flame-tight" does not imply that the enclosure is hermetically sealed but rather that the joints or flanges are held within narrow tolerances. These carefully machined joints cool the hot gases resulting from an internal explosion so that by the time they reach the outside hazardous atmosphere they are not hot enough to cause ignition.

Intrinsically safe equipment may be used in a Class I, Division 1 or Division 2 location. Intrinsically safe equipment and wiring are incapable of releasing sufficient electrical or thermal energy under normal or abnormal conditions to cause ignition of a specific hazardous atmospheric mixture in its most easily ignited concentration. The Standard for Intrinsically Safe Apparatus and Associated Apparatus for use in Class I, II, III, Division 1, Hazardous (Classified) Locations can be found in Underwriters' Laboratories standard UL 913.

The constraints around the types of enclosures that may be placed within a Class I, Division 1 or Division 2, location prevent the use of technologies that would commonly be used in other environments. For example, certain energy storage devices (e.g. certain capacitors and batteries), have the ability to create a spark and can therefore not be used in a Class I/Div1/Div2 environment. Further, standard computers, tablets and cellular phone are generally manufactured in a form that is not deemed intrinsically safe and can therefore not be used in a Class I/Div1/Div2 environment.

Accordingly, engineers are tasked with designing and building acceptable Class I/Div1/Div2 enclosures and control system technologies. However, the design of complex flame paths for explosion proof enclosures and the design of intrinsically safe barriers require significant efforts at significant cost. This is particularly true when there is a desire to transfer power and data between explosion proof enclosures and intrinsically safe devices.

SUMMARY

One aspect of the present disclosure relates to a system including an enclosure device coupled to a power supply. The system also includes an interface device having a user interface. The enclosure device is configured to induce inductive coupling with the interface device. The inductive coupling between the enclosure device and the interface device enables the transfer of power from the enclosure device to the interface device, and can also enable the transfer of data between the devices.

Another aspect of the present disclosure is directed to a system comprising an explosion proof device and an intrinsically safe device. The explosion proof device is coupled to a power supply. The intrinsically safe device includes a user interface. The explosion proof device is configured to induce inductive coupling with the intrinsically safe device. The inductive coupling between the explosion proof device and the intrinsically safe device enables the transfer of power from the explosion proof device to the user interface of the intrinsically safe device. The inductive coupling can additionally enable the transfer of data between the explosion proof device and the intrinsically safe device. The power induced in the intrinsically safe device can be high energy to operate the intrinsically safe device while low energy to comply with UL 913. In certain examples, the intrinsically safe device does not have its own independent power supply.

Another aspect of the disclosure is directed to data transmission from an explosion proof enclosure to an intrinsically safe device. The explosion proof enclosure includes a resonant transmitter circuit having a first inductor. The intrinsically safe device includes a resonant receiver circuit having a second inductor. The resonant transmitter circuit and the resonant receiver circuit are configured to be inductively coupled. The resonant transmitter circuit is further configured to transmit data to the inductively coupled receiver circuit.

Another aspect of the disclosure is directed to data transmission from an explosion proof enclosure, incorporating an inductive plug, to an intrinsically safe device. The explosion proof enclosure includes a hub into which the inductive plug is configured to fit. The inductive plug has a cavity containing at least a first inductor that is electrically coupled to a transmitter circuit housed within the explosion proof enclosure. The intrinsically safe device includes a receiver circuit having a second inductor. The transmitter circuit and the receiver circuit are configured to be inductively coupled. The transmitter circuit is further configured to transmit data to the inductively coupled receiver circuit.

Still another aspect of the disclosure is directed to a method comprising: (1) powering a transmitter circuit in an explosion proof enclosure, the transmitter circuit having a first inductor configured to operate at a resonant frequency; (2) inductively coupling the transmitter circuit to a receiver circuit of an intrinsically safe device; (3) powering the intrinsically safe device via a voltage induced in the receiver circuit by the transmitter circuit; and (4) transmitting data from the transmitter circuit to the receiver circuit via the inductive coupling.

The above summary is not intended to describe each embodiment or every implementation. A more complete understanding will become apparent and appreciated by referring to the following detailed description and claims in conjunction with the accompanying drawings.

DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
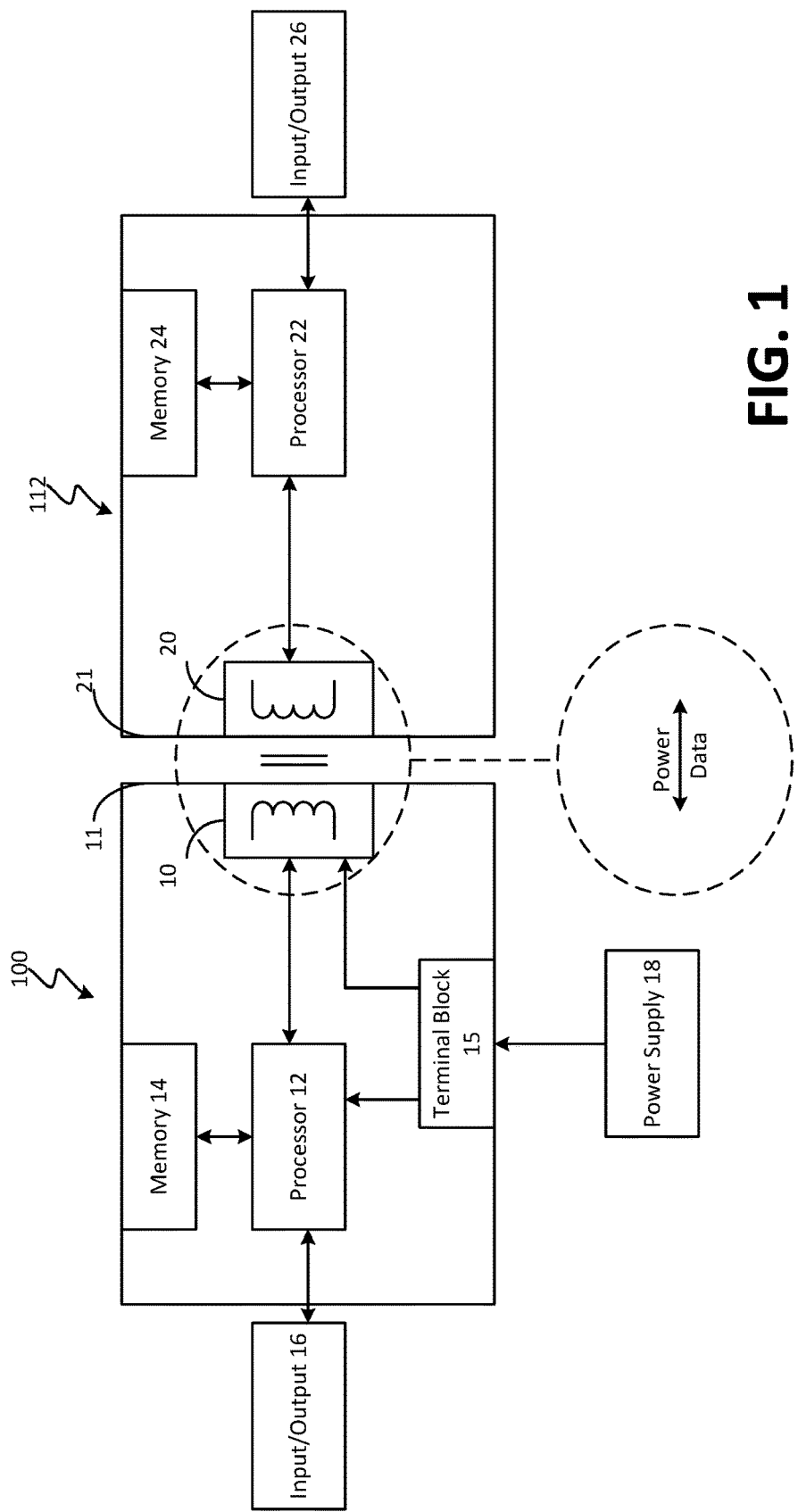
FIG. 1 is a block diagram illustrating an explosion proof device configured to be inductively coupled to an intrinsically safe device.

Referring to FIG. 1, the present disclosure is generally directed to the transmission of power and/or data between an explosion proof device 100 and an intrinsically safe device 112. To achieve power and data transmission a first inductive circuit 10 is established within or near the explosion proof device 100 proximate a non-conductive interface 11 and a second inductive circuit 20 is established within or near the intrinsically safe device 112 proximate a non-conductive interface 21.

The first inductive circuit 10 at the explosion proof device 100 is communicatively coupled to, and operates under the control of, a processor 12 that is configured to execute instructions stored in a memory 14. The processor 12 is additionally communicatively coupled to one or more inputs/output 16; historical and/or current data obtained from and/or related to the input/outputs 16 can be stored in, and retrieved from, memory 14 as can data received from the intrinsically safe device 112. A power supply 18 provides power to the processor 12, inputs/outputs 16, first inductive circuit 10 and any other electrical components within the explosion proof device 100 as necessary.

The second inductive circuit 20 at the intrinsically safe device 112 is communicatively coupled to, and operates under the control of, a processor 22 that is configured to execute instructions stored in a memory 24. The processor 22 is additionally communicatively coupled to one or more input/outputs 26; historical and/or current data obtained from and/or related to the input/outputs 26 can be stored in, and retrieved from, memory 24 as can data received from the explosion proof device 100. The second inductive circuit 20, processor 22, input/outputs 26 and other electrical components of the intrinsically safe device 112 are powered through the inductive coupling of first and second inductive circuits 10, 20 as described in further detail below. Data transfer between the first and second inductive circuits 10, 20, also described in further detail below, can occur unidirectionally or bi-directionally, as appropriate, upon the inductive coupling of the first and second inductive circuits 10, 20. Once powered, the intrinsically safe device 112 can be used as a tool for significantly more complex control, monitoring and diagnostics of an industrial system than is currently provided by the simplified push-buttons and selector switches typically currently available for Class I, Division 1 or Division 2, locations. Preferably, the intrinsically safe device does not have its own independent power supply (e.g., batteries). The inductively generated power is high enough to power the intrinsically safe device while low energy to comply with relevant standards such as UL 913.

Figure 2:
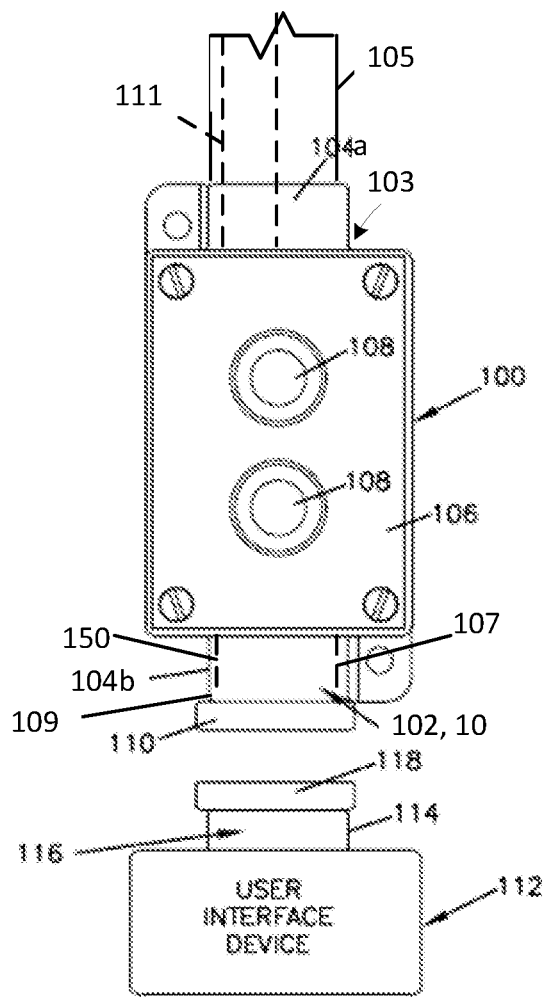
FIG. 2 is a schematic of an explosion proof enclosure incorporating an inductive conduit plug according to various embodiments of the present disclosure; the explosion proof enclosure is illustrated relative to an intrinsically safe user interface device.

Referring to FIG. 2, an example use of the first inductive circuit 10 is illustrated wherein the first inductive circuit 10 is generally contained within an inductive conduit plug 102 that may be used in conjunction with one or more explosion proof devices 100 that are suitable for a Class I, Division 1 or Division 2 locations; the inductive conduit plug 102 functions as the non-conductive interface 11. The explosion proof enclosures can comprise, for example, panel boards, control stations, motor starter enclosures, or any other enclosure to which the first inductive circuit 10 can be coupled while still maintaining the explosion proof nature of the enclosure yet allowing the first inductive circuit to establish inductive coupling (e.g., the first inductive circuit 10 requires a non-conductive interface for power and data transfer).

In certain examples and as illustrated in FIG. 2, the explosion proof device 100 can comprise a commercially available enclosure such as an EDS/EFS Series Control Station available from Crouse-Hinds, which is typically made of a FERALOY® iron alloy or a copper-free aluminum. As shown, the explosion proof device 100 generally comprises a body portion 103 having first and second hubs 104a, 104b. A hub is typically a port having internal threads for receiving a threaded conduit that provides a safe pathway for routing electrical wiring into the explosion proof enclosure. The first hub 104a can be used to receive conduit 105 that houses electrical wiring 111; the wiring 106 can be coupled to any number of industrial control system components, otherwise known as I/O, which would typically incorporate built-in flame paths. The industrial control system components can include, for example, sensors, switches, push buttons, pilot lights, motor starters, etc. The conduit 105 is threaded to the first hub 104a with the threads providing an explosion proof flame path to maintain the explosion proof nature of the device 100.

The explosion proof device 100 is additionally provided with a cover plate 106 that can merely operate as a lid to the device 100 or can incorporate various types of electrical controls. By way of example, FIG. 2 illustrates a cover plate 106 that incorporates dual push buttons 108, however, other types of controls, e.g., rocker switches, flip switches, dials, selector switches, etc., are within the purview of the present disclosure. While the device 100 and hubs 104a, 104b may be of any desired size, by way of example with reference to the EDS/EFS bodies, the dimensions of the device 100 may be approximately six inches in height, three and one-half inches in width, and two to three inches in depth with hubs 104 that are one-half to one and one-half inches in diameter. Explosion proof flame paths can be provided at the interface between the cover plate 106 and the body portion 103 of the device 100, as well as at the push buttons 108 and at any other pathway interface with the device 100.

The inductive conduit plug 102, configured to interface with hub 104b, includes a body portion 107 (see, e.g., FIG. 4) that is made of ceramic, plastic, polymer, PVC, and/or other non-conductive materials that allow for the inductive transfer of power and/or data. In certain examples, the body portion 107 can be provided with threading consistent with the threading of the conduit 105. The threading on the body portion 107 is adapted to provide an explosion proof flame path 150 (e.g., flame cooling path) similar to that provided by threading of the conduit 105. Further, because the threading of the body portion 107 is consistent with the threading of the conduit 105, the inductive conduit plug 102 can be used as a retro-fit component taking the place of existing conduit 105 without requiring modification of the explosion proof device 100. In certain examples, the body portion 107 of the inductive conduit plug 102 includes a lip edge 110 that lies proximate a bottom edge 109 of the hub 104b when threaded into position.

The body portion 107 of the inductive conduit plug 102 is further configured to accommodate the first inductive circuit 10 as well as the processor 12 and memory 14 (see FIG. 1). However, in certain examples, the processor 12 and memory 14 can be contained in the explosion proof device 100 apart from, but communicatively coupled to, the inductive conduit plug 102. In certain examples, the first inductive circuit 10 is adapted to be electrically coupled to a terminal block 15 within the explosion proof device 100; the terminal block 15 can additionally be coupled to a source of power and/or one or more industrial control system components, e.g., sensors, switches, dials, push buttons, pilot (e.g., indicator) lights, motor starters, etc., from which data may be captured and stored in memory 14. In certain examples, the inductive conduit plug 102 is configured to be removable and cleanable.

Referring still to FIG. 2, an example use of the second inductive circuit 20 is illustrated wherein the second inductive circuit 20 is generally contained within an intrinsically safe device 112 such as an intrinsically safe, user interface device that is suitable for Class I, Division 1 or Division 2 locations. Examples of such a user interface device include intrinsically safe: standalone displays, mobile phones, computers, interactive touch screens, etc.; the user interface device is preferably portable and positioned outside the enclosure, but can also be stationary. The user interface device may include digital, analog and/or mechanical interface components that provide a user interface with integrated electronics and/or circuitry (e.g., a data processor or processors, a controller, memory, a receiver and/or transmitter, control circuitry, etc.) of the user interface device. For example, the user interface device can include a keyboard, a touchscreen, keys, buttons (e.g., push buttons), switches, a display (e.g., a digital display, a display screen, a display panel, an indicator light display, etc.), lights (e.g., indicator lights), knobs, toggles, dials or other structures. The intrinsically safe device 112 in the form of a user interface device can be configured to perform various functions including monitoring, reporting, diagnostics and activation/deactivation of industrial system controls.

In certain examples, the second inductive circuit 20 is maintained within an inductive conduit plug 116 that is configured similarly to inductive conduit plug 102. The inductive conduit plug 116 includes a body portion 117 (see, e.g., FIG. 4) of a non-conductive material and a lip edge 118. The inductive conduit plug 116 is configured to be received within a hub structure 114 incorporated into the design of the intrinsically safe device 112. In certain examples, the second inductive circuit 20 is utilized without an inductive conduit plug 116 and is maintained within a non-hub, standard structure of the intrinsically safe device 112 (e.g., user interface device) proximate a non-conductive interface 21 of the intrinsically safe device 112.

Figure 3:
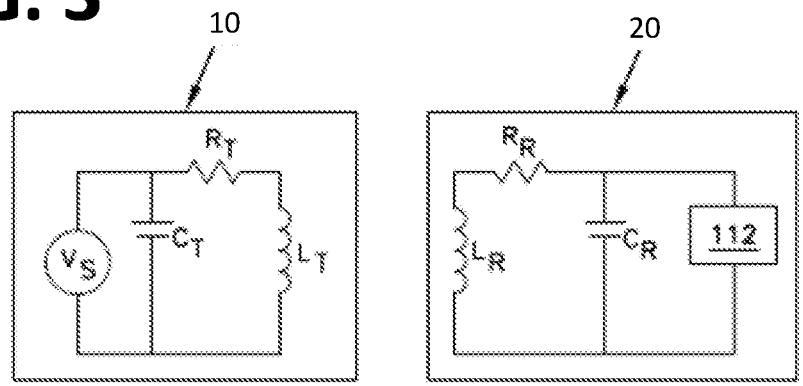
FIG. 3 is a circuit diagram illustrating the basic components of an inductively coupled transmitter and receiver for power/data transfer.

Referring to FIG. 3, a representative first inductive circuit 10, operating as a transmitter circuit, generally includes the elements of a capacitor $C_T$ and an inductor $L_T$ coupled in parallel to a voltage source $V_S$, e.g., the system power supply 18 (see FIG. 1). A resister $R_T$ is included in the transmitter circuit and represents the resistance and losses of $C_T$ and $L_T$. A representative second inductive circuit 20, operating as a receiver circuit, generally includes the elements of a capacitor $C_R$ and inductor $L_R$ coupled in parallel to a load, which comprises the intrinsically safe device 112 in the form of a user interface device. A resistor $R_R$ is included in the receiver circuit and represents the resistance and losses of $C_R$ and $L_R$.

The first inductive circuit 10 and second inductive circuit 20 are configured for wireless power transfer using resonant inductive coupling which can be described as follows. The voltage source $V_S$ causes a current flow to in the first inductive circuit 10, e.g. the transmitter circuit. With the plates of the capacitor $C_T$ connected to opposite ends of the inductor $L_T$, the current causes $C_T$ to charge. Once $C_T$ is charged, $C_T$ will start to discharge through $L_T$ and, as it does, $L_T$ will create a magnetic field. Once $C_T$ discharges, $L_T$ will try to keep the current in the transmitter circuit moving, so it will charge up the other plate of $C_T$. Once the magnetic field of $L_T$ collapses, $C_T$ has been recharged, but with opposite polarity, so $C_T$ discharges again through the inductor, thus $L_T$ begins to resonate with its resonant frequency being a function of the inductance of $L_T$ and the capacitance $C_T$.

The second inductive circuit 20, e.g., the receiver circuit, is equipped with components that will produce the same resonant frequency as the transmitter circuit (first inductive circuit 10). With the transmitter circuit in a resonant mode, e.g. an oscillating current producing an oscillating magnetic field, the receiver circuit is brought near the transmitter circuit where the oscillating magnetic field of the transmitter circuit induces a voltage in $L_R$ of the receiver circuit. The transfer of voltage to $L_R$ causes the receiver to generate a current and to resonate at the same resonant frequency as the transmitter. The voltage in the receiver is then used to power the various electrical components of the intrinsically safe user interface device 112.

Figure 4:
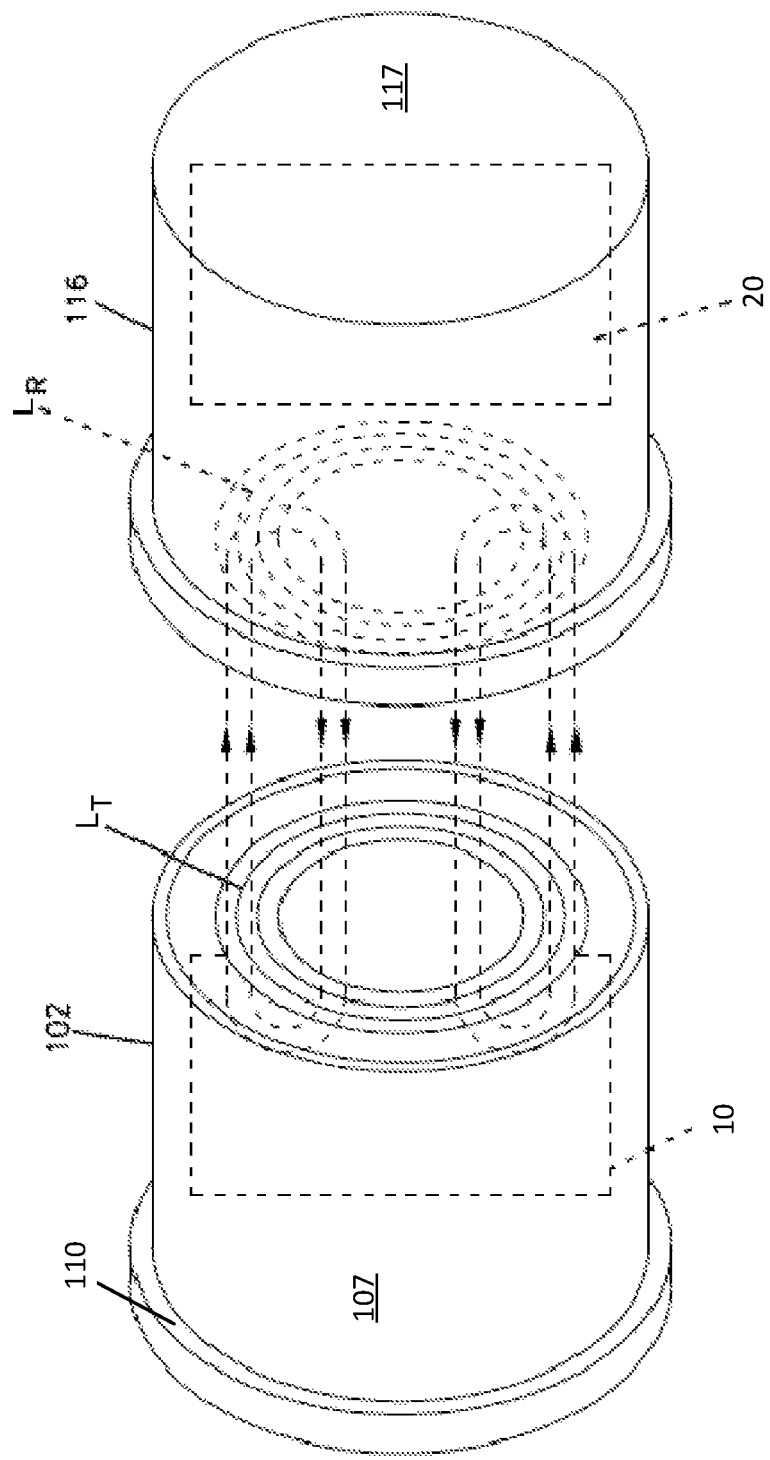
FIG. 4 is a schematic illustrating the oscillating magnetic field of an inductively coupled transmitter and receiver according to various embodiments of the present disclosure.

FIG. 4 illustrates the alternating magnetic field that exists between the first inductive circuit 10, e.g., the transmitter, and the second inductive circuit 20, e.g., the receiver, upon inductive coupling. Note that the inductors $L_T$ and $L_R$ are of a pancake configuration, which has been found to be the configuration most easily used. However, other forms of inductors may be used without departing from the spirit or scope of the invention. Accordingly, in operation, the power, $V_S$, supplied to the first inductive circuit 10 is converted into a high frequency alternating current whereby the alternating current flows in $L_T$ and generates an oscillating magnetic field. Energy from the magnetic field induces an alternating current in $L_R$ and the alternating current is then converted into a direct current within the intrinsically safe device 112 where it is used to power other electronic components, e.g., the processor 22 and other inputs/outputs 26 coupled to the processor 22 (e.g. inputs from a user interface touchscreen or keyboard, etc.)

As explained above, by generating a low-power oscillating magnetic field, power can be transmitted from the first inductive circuit 10 within the explosion proof device 100 to the second inductive circuit 20 within the intrinsically safe device 112. Because the magnetic field is oscillating at a relatively high frequency (~100-400 kHz), the size of the storage components within the circuits 10, 20, e.g., the inductors and capacitors, can be extremely small, e.g., much lower than that specified by Underwriter Laboratories standard UL 913. Further, because magnetic fields decay very quickly in space, the amount of energy, e.g., milliwatts, present in the generated magnetic field can be made to comply with intrinsically safe standards (UL 913).

Figure 5A:
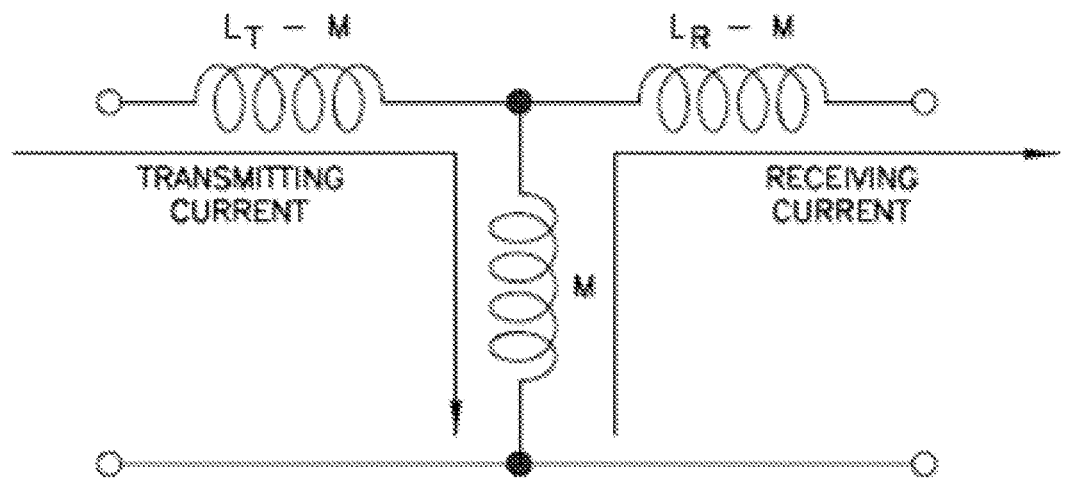
FIG. 5A is a schematic illustrating power transmission between a transmitter circuit and receiver circuit according to various embodiments of the present disclosure; data is transmitted from transmitter to receiver by pausing power transmission.
Figure 5B:
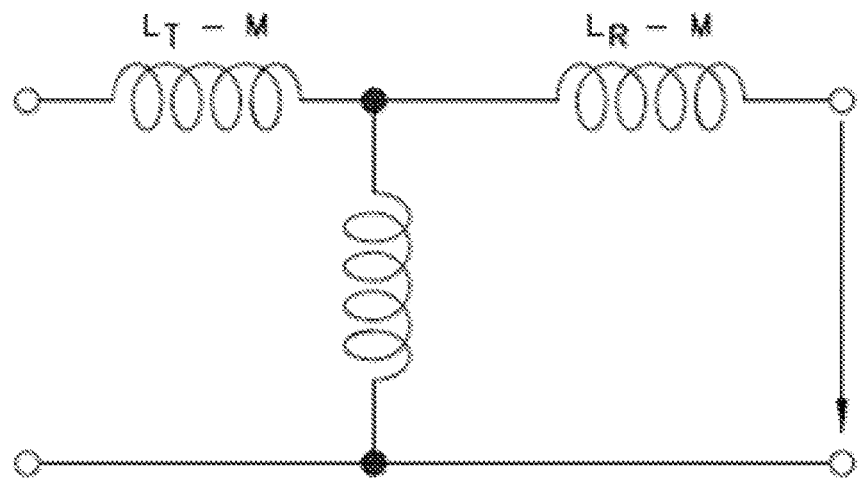
FIG. 5B is a schematic illustrating data transmission from the receiver circuit to the transmitter circuit by shorting the inductor of the receiver circuit according to various embodiments of the present disclosure.

Data transmission between the explosion proof device 100 and an intrinsically safe device 112 may now be better understood with reference to FIGS. 5A and 5B. Inductive power transfer requires an air-gap transformer comprising the primary inductor, $L_T$, the secondary inductor, $L_R$, and the mutual inductance shared by the two windings, M. M is small relative to $L_T$ and $L_R$, as air is a very poor conductor of magnetic flux. Pausing power transmission at the first inductive circuit 10, e.g., the transmitter circuit, can be identified at the second inductive circuit 20, e.g., the receiver circuit, as data being sent. Alternatively, if $L_R$ is shorted momentarily by the receiver circuit, the mutual inductance will effectively be shorted as well. This will cause a phase shift in the resonant circuit of the first inductive circuit 10, e.g., the transmitter circuit, which can be identified at the transmitter circuit as data being sent.

Because the data being sent can be close in frequency to the power being sent, it can be difficult to identify a bit clearly. However, if the transmitted data waveform is sampled at the rate of a reference clock of the processor 12 or 22, e.g., 125 kHz, a phase shift can be seen. A filter can additionally be used at the processor 12 or 22 to level shift the data so that it can be more easily sampled by processor 12 or 22.

Figure 6:
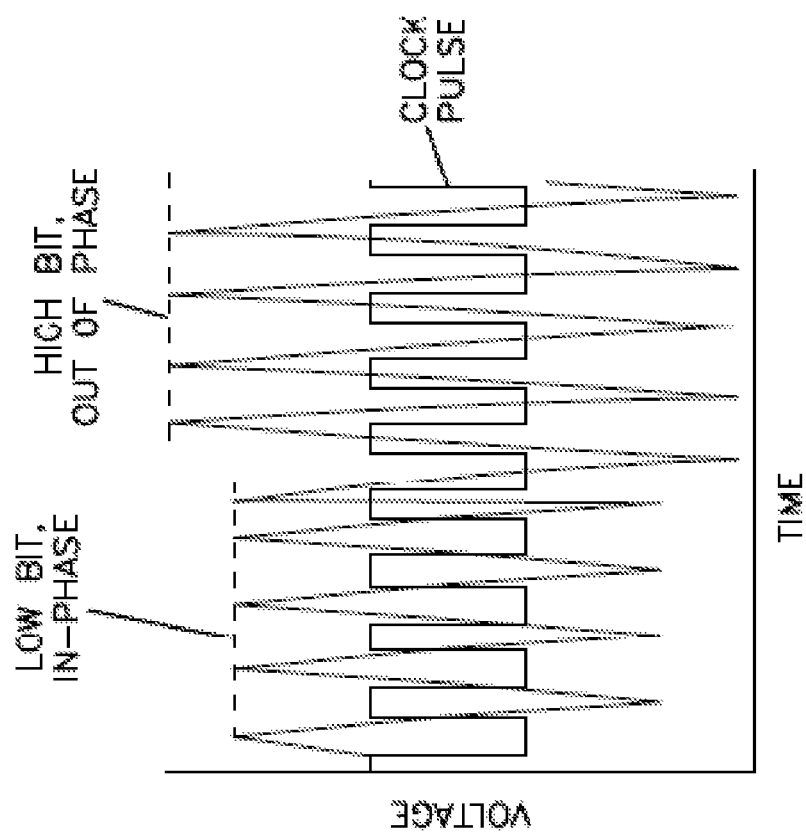
FIG. 6 is a graph illustrating phase shift in an output of the transmitter circuit indicating that the receiver circuit has transmitted data according to various embodiments of the present disclosure.
Figure 7:
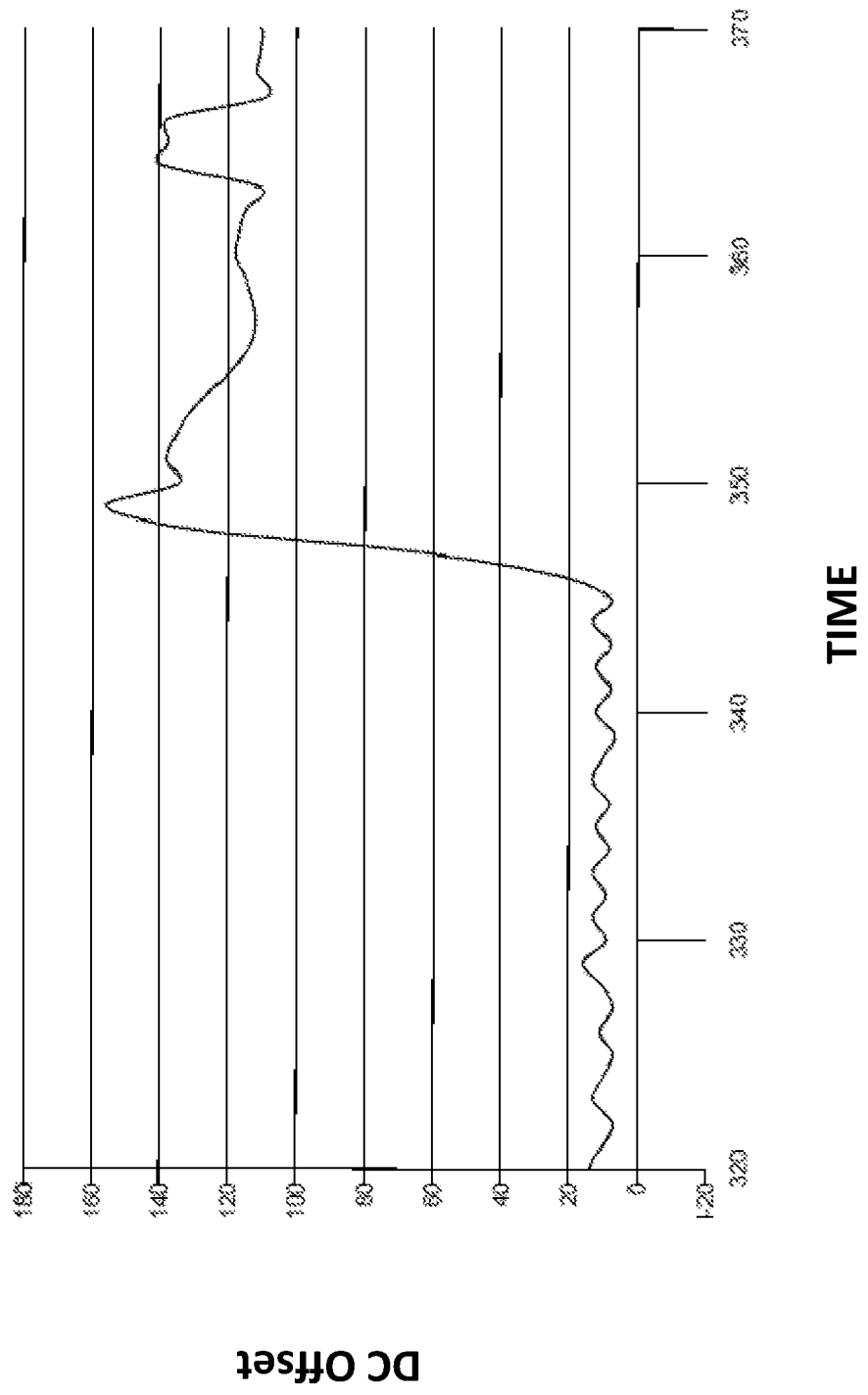
FIG. 7 is a graph providing a digital representation of the waveform of FIG. 6.

FIG. 6 illustrates the phase shift with the centrally positioned clock signal at 125 kHz relative to the phase shifted transmitted waveform (both a low bit and a high bit transmission are illustrated). Note that when sampling a waveform at its fundamental frequency, the waveform is aliased to DC (direct current), so that any phase shift is observed to be a DC offset after analog to digital conversion. FIG. 7 illustrates the digital waveform obtained from the waveform of FIG. 6 after sampling at the clock frequency, e.g., the 125 kHz signal is removed. The waveform of FIG. 7 shows the DC offset which indicates the phase of the 125 kHz signal a certain point in time.

The data transmitted from the first inductive circuit 10 to the second inductive circuit 20, or from circuit 20 to circuit 10, can include current and historical parameter data related to the industrial system that is obtained by the processor 12 or 22 and stored in memory 14 or 24. The parameter data can be obtained from various control elements such as sensors, switches, push buttons, pilot lights, etc. Sensors can, for example, provide parameters related to temperature, humidity, speed, voltage, current, etc. Switches, push buttons, pilot lights, etc., can, for example, provide parameters related to when each element has been activated or deactivated or the number of times that each element has been activated or deactivated; etc. Further, the data transmitted from the first inductive circuit 10 to the second inductive circuit 20, or from circuit 20 to circuit 10, can include instructive data to activate/deactivate a sensor, switch, push button, pilot light, motor starter, etc. Other types of data may be transmitted between circuit 10 and circuit 20 without departing from the spirit or scope of the invention.

The above-described power and data transmission schemes illustrate that power and data transmission between explosion proof devices and intrinsically safe devices can occur within a Class I, Division 1 or Division 2 location without the use of physical electrical connections, e.g., power and data can be transferred without electrical contacts that can cause sparks or suffer damage. Further, the above-described power transmission scheme illustrates a situation wherein a plurality of intrinsically safe devices can be powered by a single inductive circuit within an explosion proof device.

Figure 8:
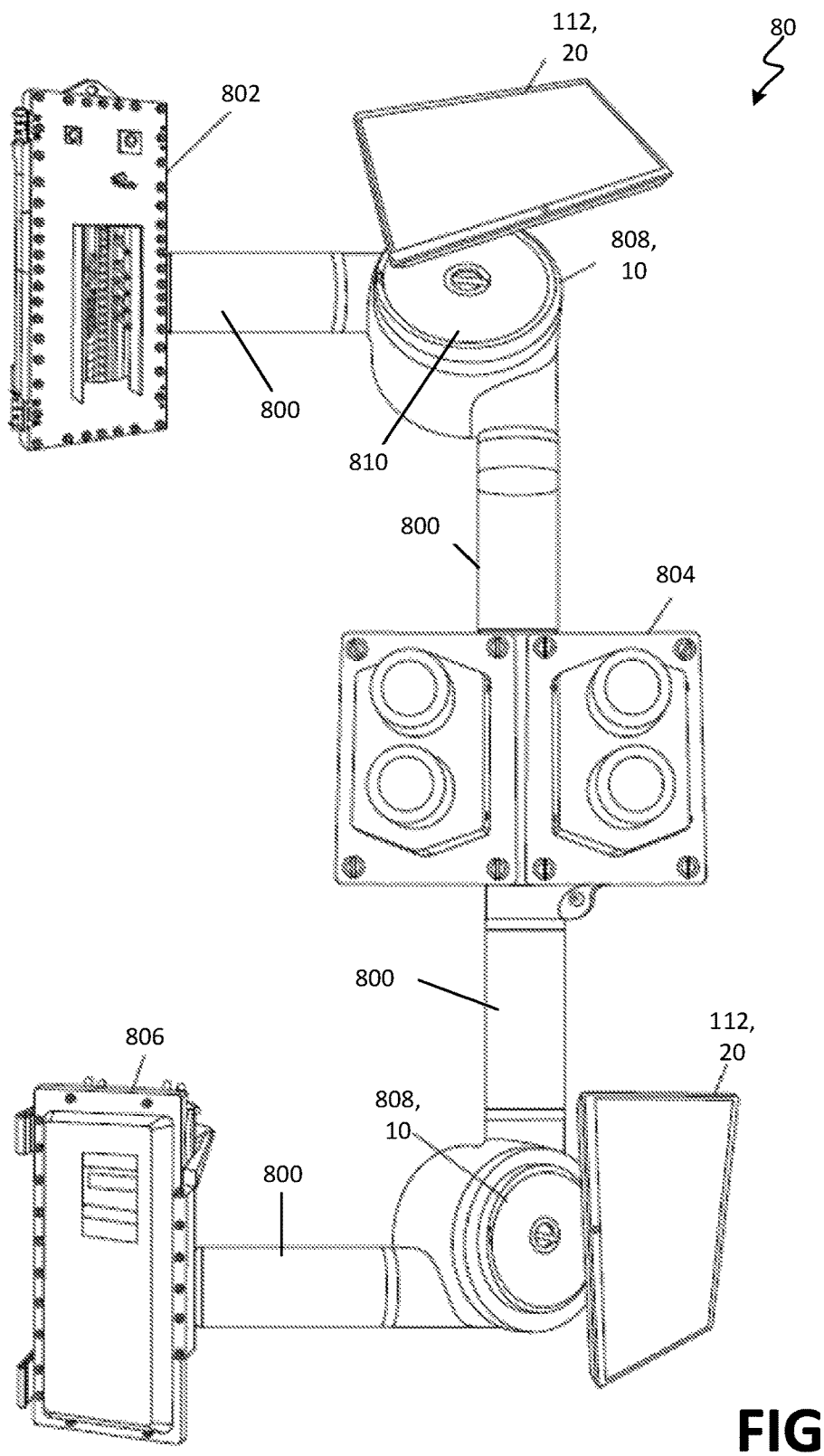
FIG. 8 is a schematic illustrating other components that may incorporate the transmitter or receiver circuits according to various embodiments of the present disclosure.

It should be noted that, while the description above has described a certain example use of the first inductive circuit 10 within an inductive conduit plug 102, the first inductive circuit 10 can be implemented in other configurations. FIG. 8 illustrates a simplified industrial system 80 including various components connected by various conduit runs. More specifically, the system 80 includes a panel board 802 connected by conduit 800 to a control station 804 which is connected by conduit 800 to a motor starter enclosure 806. The panel board 802 includes a circuit breaker that enables power to be supplied to the push buttons of the control station 804; depression of a pushbutton at the control station 804 can activate or deactivate a motor starter at enclosure 806. Along the explosion proof conduit runs 800, a conduit outlet box 808 (in this instance a Condulet GUA Series Explosion Proof Conduit Outlet Box) has been fitted with the first inductive circuit 10, e.g., transmitter circuit, to communicate with the second inductive circuit 20 contained within the intrinsically safe device 112. In this particular configuration the conduit outlet box 708 has been enclosed by a windowed, non-conductive lid 810, rather than a standard metal lid, to enable the inductive coupling between the first inductive circuit 10 and second inductive circuit 20. The first inductive circuit 10 can be coupled to its own processor 12 at the outlet box 808 or may be coupled to a system processor located elsewhere in the system 80. In other examples, inductive power and/or data transfer circuits can be incorporated at any of the components (e.g., at the panel board 802, motor starter enclosure 806, control station 804, and/or other outlet boxes 808).

Systems, devices or methods disclosed herein may include one or more of the features, structures, methods, or combination thereof described herein. For example, a device or method may be implemented to include one or more of the features and/or processes above. It is intended that such device or method need not include all of the features and/or processes described herein, but may be implemented to include selected features and/or processes that provide useful structures and/or functionality. Additionally, while aspects of the present disclosure are preferred for use with explosion-proof enclosures, such aspects are also applicable to other types of enclosures and enclosure devices that may not be explosion-proof. Further, while aspects of the present disclosure are particularly suited for use with intrinsically safe devices such as intrinsically safe user interface devices, such aspects are also applicable for use with devices (e.g., user interface devices) that may not be intrinsically safe.

Various modifications and additions can be made to the disclosed embodiments discussed above. Accordingly, the scope of the present disclosure should not be limited by the particular embodiments described above, but should be defined only by the claims set forth below and equivalents thereof.

What is claimed:

1. A system comprising:
   an enclosure device coupled to a power supply; and
   an intrinsically safe interface device having a user interface, wherein the interface device lacks an independent power source, and
   wherein the enclosure device is configured to induce inductive coupling with the interface device and wherein the inductive coupling between the enclosure device and the interface device enables the transfer of power from the enclosure device to the interface device.

2. The system of claim 1, wherein the inductive coupling between the enclosure device and the interface device enables the transfer of data between the enclosure device and the interface device.

3. The system of claim 1, wherein the enclosure device comprises an outlet box, a control station, a panel board, or a motor starter enclosure.

4. The system of claim 1, wherein the power transferred between the enclosure device and the interface device is of a high enough energy to power the interface device but of low enough energy to comply with Underwriters' Laboratories standard UL 913.

5. The system of claim 1, wherein the inductive coupling of the enclosure device is generated by an inductive circuit contained within a plug, wherein the plug includes threads enabling the plug to interface with a port of the enclosure device.

6. The system of claim 5, wherein the threaded interface between the plug and the port of the enclosure device provides a flame cooling path.

7. The system of claim 5, wherein the threaded interface is of a non-conductive material.

8. The system of claim 1, wherein enclosure device includes electrical controls comprising one or more of push buttons, rocker switches, flip switches, dials, selector switches, and indicator lights.

9. The system of claim 1, wherein the enclosure device includes an explosion-proof enclosure.

10. A system comprising:
    an explosion proof enclosure including a resonant transmitter circuit having a first inductor;
    an intrinsically safe device including a resonant receiver circuit having a second inductor, wherein the resonant transmitter circuit and the resonant receiver circuit are configured to be inductively coupled, wherein the intrinsically safe device lacks a power source; and
    wherein the resonant transmitter circuit is configured to transmit data to the inductively coupled receiver circuit.

11. The system of claim 10, wherein the resonant transmitter circuit is additionally configured to power the intrinsically safe device via the inductive coupling of the resonant transmitter circuit and the resonant receiver circuit.

12. The system of claim 11, wherein the resonant transmitter circuit is configured to transmit data by pausing power transmission to the resonant receiver circuit.

13. The system of claim 12, wherein the resonant receiver circuit of the intrinsically safe device is additionally configured to transmit data to the resonant transmitter circuit.

14. The system of claim 13, wherein the resonant receiver circuit is configured to transmit data by shorting the second inductor.

15. The system of claim 14, wherein shorting the second inductor causes a phase shift in an output of the resonant transmitter circuit.

16. A system comprising:
    an explosion proof enclosure having a hub;
    a plug configured to fit within the hub, the plug having a cavity containing at least a first inductor electrically coupled to a transmitter circuit housed within the explosion proof enclosure;
    an intrinsically safe device including a receiver circuit having a second inductor, wherein the transmitter circuit and the receiver circuit are configured to be inductively coupled and wherein the intrinsically safe device lacks a power source; and
    wherein the transmitter circuit is configured to transmit power and/or data to the inductively coupled receiver circuit.

17. The system of claim 16, wherein the transmitter circuit is configured to transmit data by pausing power transmission to the receiver circuit.

18. The system of claim 16, wherein the receiver circuit of the intrinsically safe device is additionally configured to transmit data to the transmitter circuit.

19. The system of claim 18, wherein the receiver circuit is configured to transmit data by shorting the second inductor.

20. The system of claim 19, wherein shorting the second inductor causes a phase shift in an output of the transmitter circuit.

21. The system of claim 16, wherein the plug is fabricated from a non-conductive material.

22. The system of claim 17, wherein the plug is configured to be removable.

23. A method comprising:
- powering a transmitter circuit in an explosion proof enclosure, the transmitter circuit having a first inductor configured to operate at a resonant frequency;
- inductively coupling the transmitter circuit to a receiver circuit of an intrinsically safe device, wherein the intrinsically safe device lacks an independent power source; and
- powering the intrinsically safe device via a voltage induced in the receiver circuit by the transmitter circuit.

24. The method of claim 23, further comprising transmitting data from the transmitter circuit to the receiver circuit via the inductive coupling.

25. The method of claim 23, further comprising powering an additional intrinsically safe device containing a receiver circuit via voltage induced in the receiver circuit by the transmitter circuit.

26. The method of claim 24, transmitting data from the transmitter circuit to the receiver circuit by pausing the power transmitted from the transmitter circuit to the receiver circuit.

27. The method of claim 24, further comprising transmitting data from the receiver circuit to the transmitter circuit.

28. The method of claim 27, transmitting data from the receiver circuit to the transmitter circuit by shorting the second inductor.

* * * * *